United States Patent [19]

Katumata

[11] Patent Number: 5,210,731
[45] Date of Patent: May 11, 1993

[54] INFORMATION PROCESSING APPARATUS WITH MISSING PULSE DETECTION AND CORRECTION

[75] Inventor: Makoto Katumata, Chiba, Japan

[73] Assignee: Kabushiki Kaisha Toshiba, Kanagawa, Japan

[21] Appl. No.: 456,784

[22] Filed: Dec. 29, 1989

[30] Foreign Application Priority Data

Jun. 1, 1989 [JP] Japan ........................................ 64-460

[51] Int. Cl.$^5$ .......................... G11B 7/00; G11B 21/08
[52] U.S. Cl. .................................... 369/44.28; 369/32; 369/44.26; 369/44.32; 369/58
[58] Field of Search ..................... 369/32, 44.28, 44.32, 369/44.26, 54, 58

[56] References Cited

U.S. PATENT DOCUMENTS

| | | | |
|---|---|---|---|
| 4,811,316 | 3/1989 | Hosoya | 369/32 |
| 4,839,876 | 6/1989 | Fennema | 369/32 |
| 4,974,221 | 11/1990 | Hosoya et al. | 369/44.32 |
| 4,989,190 | 1/1991 | Kuroe et al. | 369/32 |
| 5,027,338 | 6/1991 | Ata | 369/44.32 |
| 5,038,333 | 8/1991 | Chow et al. | 369/44.28 |
| 5,073,881 | 12/1991 | Akiyama | 369/44.32 |
| 5,151,888 | 9/1992 | Shikichi et al. | 369/44.25 |

*Primary Examiner*—Roy N. Envall, Jr.
*Assistant Examiner*—Jennifer L. Hazard
*Attorney, Agent, or Firm*—Finnegan, Henderson, Farabow, Garrett & Dunner

[57] ABSTRACT

An apparatus is provided for a disc-shaped information recording medium having a plurality of information recording tracks formed thereon with substantially equal distances therebetween in the spiral or concentric fashion. The apparatus further includes a recording/reproducing head for recording and reproducing information on and from the information recording tracks. The apparatus is capable of detecting information from the medium when the head is moved in the radial direction of the medium. A track detection pulse signal is extracted from the information detected by the apparatus when the head is moved in the radial direction. If a pulse is missing, the apparatus generates a pulse signal corresponding to the missing pulse, corrects the analog signal, and synthesizes a new signal.

8 Claims, 5 Drawing Sheets

INFORMATION PROCESSING APPARATUS WITH MISSING PULSE DETECTION AND CORRECTION

BACKGROUND OF THE INVENTION

1. Field of the Invention:

This invention relates to an information processing apparatus, and more particularly to an improved apparatus for use in accessing the information recording tracks formed on the medium in a spiral or concentric fashion.

2. Description of the Prior Art:

Conventionally, when an optical disc is used as an information recording medium, precise access must be made from one track to another formed on the optical disc in a radial direction. A two-step access technique that includes coarse access and fine access has been employed.

To achieve the coarse access, an optical head incorporating an objective lens and many other optical parts is moved by a linear motor to a position near the desired track. Thereafter, the objective lens, which is supported movably in a direction crossing the tracks, is moved by a lens actuator so as to achieve fine access.

However, such a two-step access technique requires a complicated structure and takes time to achieve the desired access. Further, erroneous tracking can easily occur due to erroneous detection of the track.

SUMMARY OF THE INVENTION

Accordingly, one object of this invention is to provide an information processing apparatus that can easily, quickly and precisely achieve access to a desired track formed on an information recording medium.

Briefly, in accordance with one aspect of this invention, there is provided an information processing apparatus for a disc-shaped information recording and retrieval medium having a plurality of information recording tracks formed thereon with substantially equal distance therebetween in a spiral or concentric fashion, which comprises a recording/reproducing head for recording and reproducing information on and from the information recording tracks, means for moving the head at substantially a constant speed in a radial direction with respect to the medium, detecting means for detecting information from the medium when the head is moved in the radial direction of the medium, track detection pulse signal extracting means for extracting a analog signal from the information detected by the detecting means when the head is moved in the radial direction, the extracted analog signal being a series of pulses indicating each time the head crosses one of the tracks, speed signal generating means for generating a signal corresponding to the radial speed of the head, missing pulse detecting means for detecting a missing pulse in the analog signal, pulse generating means for generating a pulse signal corresponding to the missing pulse, and correcting means for synthesizing a new analog signal from the extracted analog signal and the pulse signal generated by the pulse generating means.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
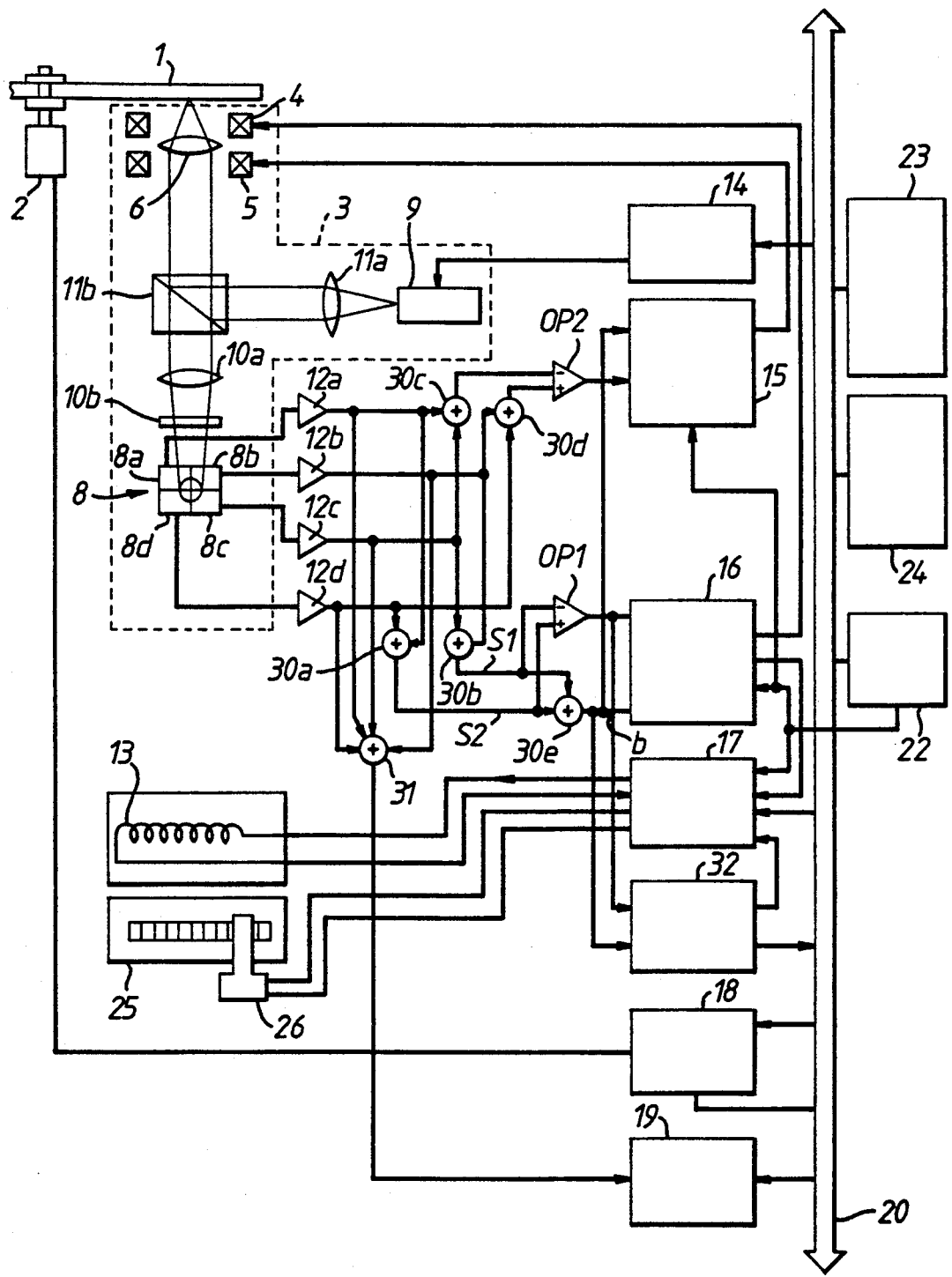
FIG. 1 is a block diagram illustrating the configuration of an optical disc information processing system incorporating one embodiment according to the present invention.

Referring now to the drawings, wherein like reference numerals designate identical or corresponding parts throughout the several views, and more particularly to FIG. 1 thereof, one embodiment of this invention will be described.

FIG. 1 shows a block diagram illustrating an optical disc information processing system that incorporates a tracking control apparatus according to one embodiment of the present invention.

In FIG. 1, information recording tracks are formed with substantially equal distance between them on the surface of an optical disc 1 in a spiral fashion or in a concentric fashion. The optical disc 1 is rotated at a prescribed constant speed by an electric motor 2. The rotation of motor 2 is controlled by a motor control circuit 18. An optical head 3 serves to record information on the optical disc 1, and to reproduce recorded information therefrom. The optical head 3 is fixed to a moving coil 13 that constitutes a movable unit of a linear motor. The moving coil 13 is connected to a linear motor control circuit 17. A linear motor position detector 26 is connected to the linear motor control circuit 17. The position detector 26 detects an optical scale 25 provided on the optical head 3 so as to produce a signal indicative of the present position of the optical head 3. A permanent magnet (not shown) is provided in the stationary unit of the linear motor. Thus, when the moving coil 13 is energized by the linear motor control circuit 17, the optical head 3 is moved at substantially a constant speed in the radial direction of the optical disc 1.

The optical head 3 comprises an objective lens 6 which is movably supported by wires or flat springs. The objective lens 6 is moved by a drive coil 5 in a focusing direction (the optical axis direction of lens 6). Further, the objective lens 6 is moved by a drive coil 4 in a direction that intersects perpendicularly to the optical axis of lens 6. A laser diode 9 is operated in accordance with signals produced from a laser control circuit 14. Light beams emitted from the laser diode 9 are applied to the optical disc 1 through a collimator lens 11a, a half prism 11b and the objective lens 6. Further, light beams reflected from the optical disc 1 are fed into an optical detector 8 through the objective lens 6, the half prism 11b, a focusing lens 10a and a cylindrical lens 10b.

The optical detector 8 consists of four partitioned light detector cells 8a, 8b, 8c and 8d. The output signals of the light detector cells 8a, 8b, 8c and 8d are respectively fed into amplifiers 12a, 12b, 12c and 12d. The output signal from the amplifier 12a is fed into one input of a low-speed adder 30a and also into one input of a low-speed adder 30c and one of four inputs of a high-speed adder 31. Further, the output signal from the amplifier 12b is fed into one input of a low-speed adder 30b and also into one input of a low-speed adder 30d and another input of the adder 31. The output signal of the amplifier 12c is fed into the other input of the low-speed adder 30b and also into the other input of the low-speed adder 30c and another input of the adder 31. The output signal of the amplifier 12d is fed into the other input of the low-speed adder 30a and also into the other input of the low-speed adder 30d and still another input of the adder 31.

An output signal $S_1$ from the adder 30b and an output signal $S_2$ from the adder 30a are respectively fed into an inverting input and a non-inverting input of an operational amplifier $OP_1$. An output of the operational amplifier $OP_1$ is fed into a tracking control circuit 16. Further, the output signals $S_1$ and $S_2$ of the adders 30b and 30a fed into an adder 30e. An output signal b from the adder 30e is also fed into the tracking control circuit.

Here, assume that the optical head 3 has achieved access to the desired track by the action of the linear motor. The tracking control circuit 16 produces a drive signal which is supplied to the drive coil 4 provided in the optical head 3. Thus, the objective lens 6 is moved so as to precisely oppose the desired track. As a result, the light beam 11a is moved accurately to the desired track (later described in detail).

An output signal from the low-speed adder 30c is fed into an inverting input of an operational amplifier $OP_2$. Further, an output signal from the low-speed adder 30d is fed into a non-inverting input of the operational amplifier $OP_2$. As a result, the operational amplifier $OP_2$ produces a signal proportional to the difference between the output signals of the low-speed adders 30c and 30d. The output signal from the operational amplifier $OP_2$ is fed into a focusing control circuit 15 as a focusing signal. Further, the output signal b of the adder 30e is also fed into the focusing control circuit 15. The focusing control circuit 15 produces a signal which is fed into the focusing drive coil 5. As a result, the light beam from the laser diode 9 is precisely focused on the surface of the optical disc 1. The focusing and tracking of the objective lens 6 are performed in the above-described manner.

In this case, the respective output signals of the light detector cells 8a through 8d are added so as to precisely correspond to the irregularities of pits (i.e., recorded information) on the surface of the optical disc 1. The thus added output signal is fed through the high-speed adder 31 into a data reproducing circuit 19, which, in turn, reproduces image information and address information (e.g., track number, sector number, etc.). The output signal produced from the operational amplifier OP1 and the output signal produced from the adder 30e are respectively fed into a track counter circuit 32. An output signal produced from the track counter circuit 32 is fed into the linear motor control circuit 17.

The laser control circuit 14, the focusing control circuit 15, the tracking control circuit 16, the linear motor control circuit 17, the motor control circuit 18, the data reproducing circuit 19 and the track counter circuit 32 are connected through a bus line 20 to a CPU (central processing unit) 23. The CPU 23 controls these circuits 14 through 19 in accordance with a prescribed program stored in a memory unit 24. Further, the focusing control circuit 15, the tracking control circuit 16, and the linear motor control circuit 17 are controlled in accordance with signals produced from a D/A (digital-to-analog) converter 22.

Figure 2:
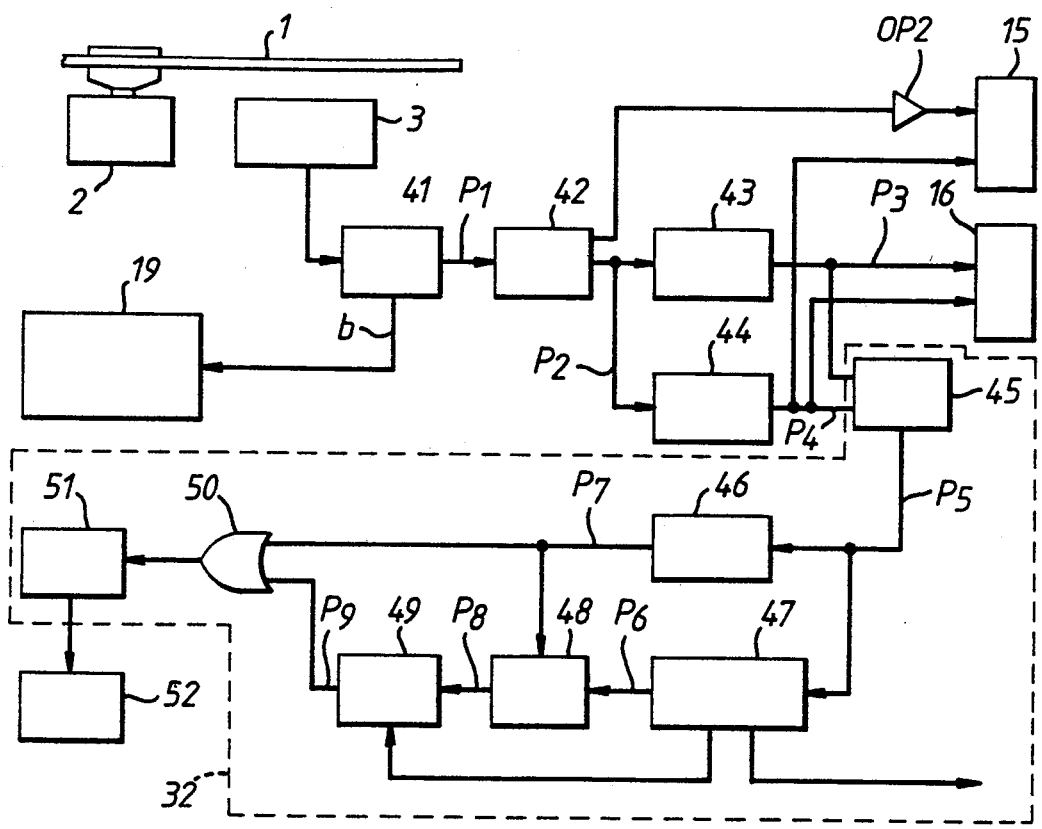
FIG. 2 is a more detailed block diagram illustrating the configuration of one embodiment according to the present invention.
Figure 3A:
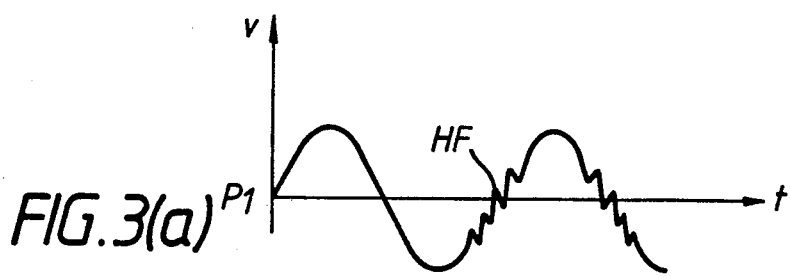
FIGS. 3a–b, 4a–c, and 5a–f are waveform diagrams for explaining the operation of one embodiment according to the present invention.

In this embodiment of the invention, the track counter circuit 32 comprises circuits and devices as shown by a dotted line in FIG. 2. In FIG. 2, the signal $P_1$ produced from a head amplifier 41 (which corresponds to the amplifiers 12a through 12d shown in FIG. 1) is fed into a low pass filter (LPF) 42. The waveform of a signal $P_1$ includes a high frequency component HF, as shown in FIG. 3a. The high frequency component HF is eliminated by the LPF 42 (which corresponds to the adders 30a through 30d shown in FIG. 1), and the waveform shown in FIG. 3b can be obtained as a signal $P_2$. Referring now back to the waveform of the signal $P_1$ of FIG. 3a, the low frequency in the waveform corresponds to the track portions of the optical disc 1. Further, the high frequency in the waveform corresponds to the portions between the tracks. The high frequency component HF in the waveform corresponds to noise caused by undesired pits formed between the tracks, or caused by a stain or dust attached to the surface of the optical disc 1.

Figure 3B:
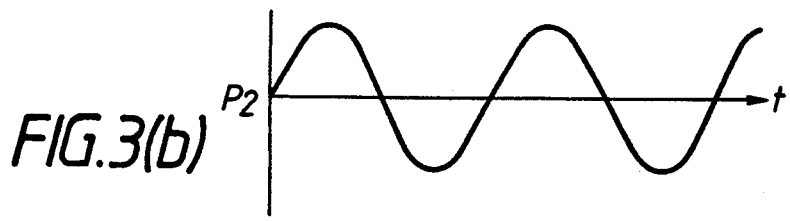
Figure 4A:
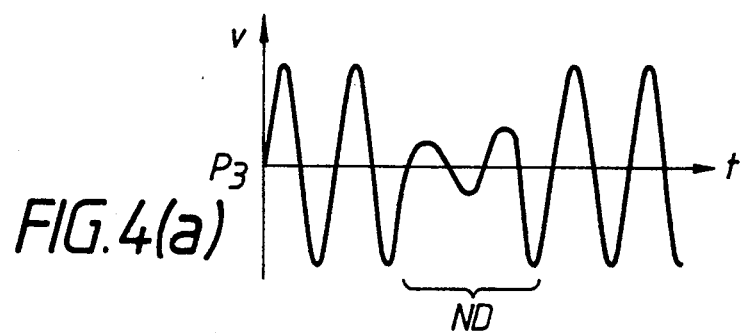
Figure 4B:
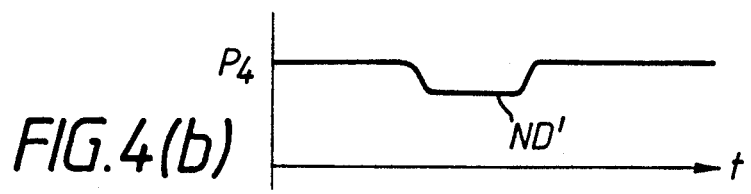

The signal $P_2$ produced from the LPF 42, having a waveform shown in FIG. 3b, is fed into a track error signal circuit 43 (which corresponds to the operational amplifier OP1 shown in FIG. 1) and an integration circuit 44. The waveform of FIG. 3b illustrates the signal generated when the optical head 3 has crossed the tracks in which image information (hereinafter simply referred to as data) is recorded. When the optical head 3 crosses a track having a stain or dust attached thereto i.e., a portion having a reflectivity different from the normal portions, the track error signal circuit 43 produces an output signal $P_3$, a portion of which (represented by ND) is smaller than other portions, as shown in FIG. 4a. As described above, the output signal of the LPF 42 is also fed into the integration circuit 44, wherein the amplitude of the signal $P_3$ is integrated so as to form a signal $P_4$, as shown in FIG. 4b. The signal $P_4$ is a D.C. output signal that includes a portion ND' corresponding to the portion ND of the signal $P_3$.

Figure 4C:
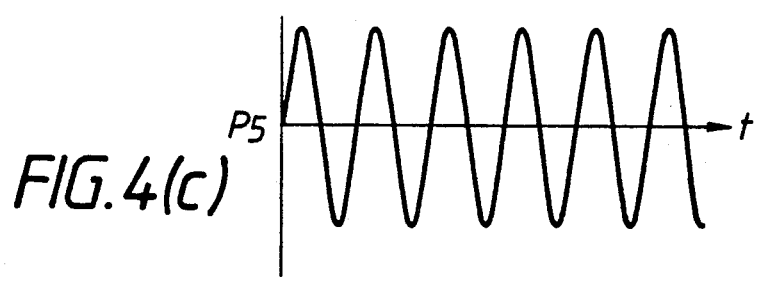

The thus obtained signals $P_3$ and $P_4$ are fed into an AGC (automatic gain control) circuit 45. The AGC circuit 45 serves to shape the signal $P_3$ into a signal $P_5$ shown in FIG. 4c in the following manner. Specifically, the gain of the AGC circuit 45 is automatically controlled in accordance with the signal $P_4$. As a result, even when the optical head 3 crosses a track having a reflection coefficient different from the normal portion, signal $P_5$ having an amplitude substantially constant in both polarities can be obtained, as shown in FIG. 4c. The signal $P_5$ is then fed into a comparison circuit 46 and a frequency-to-speed conversion circuit 47. The circuit 47 produces a signal $P_6$ (FIG. 5b) having a DC voltage corresponding to the radial movement speed of the optical head 3 on the basis of the signal $P_5$ or the signal $P_5'$ (FIG. 5a, later described in detail).

Here, assume that the track intervals of the optical disc 1 are substantially the same, and the optical head 3 is moved at substantially a constant speed. In this case, a track detecting signal would have a waveform as that of the signal $P_5$ shown in FIG. 4c. However, if the radial movement speed of the optical head 3 is changed, the period of the waveform would be changed as shown in FIG. 5a (signal $P_5'$). Assume that the radial movement speed of the optical head 3 is changed at a time $t_1$ so as to reduce to zero.

Figure 5A:
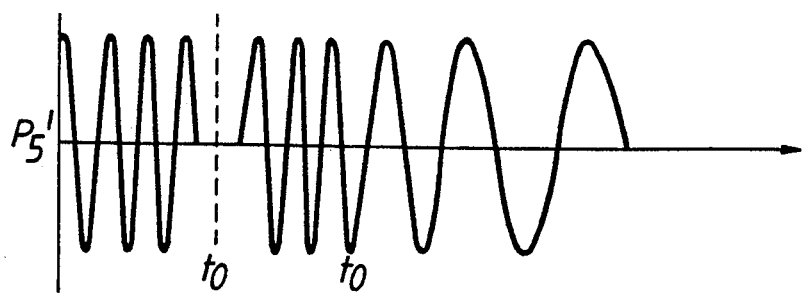
Figure 5B:
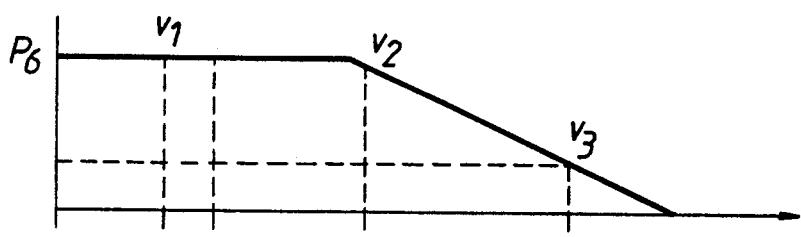
Figure 5C:
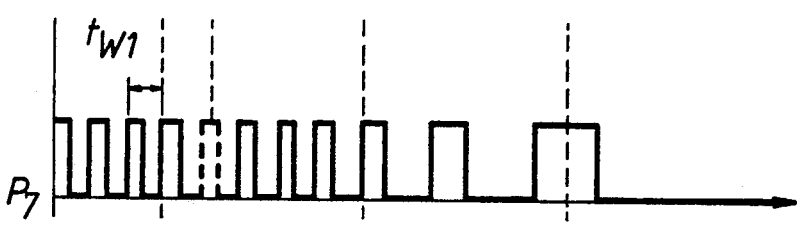
Figure 5D:
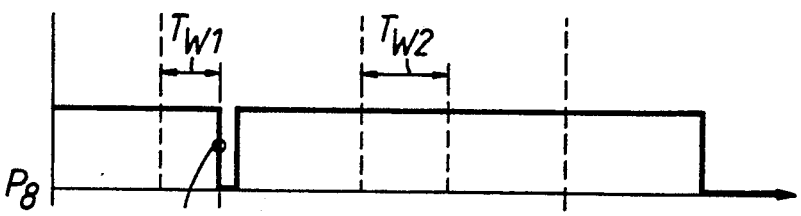

The period of the waveform of the signal $P_5'$ will become longer after the time $t_1$, as shown in FIG. 5a. In accordance with this change, the circuit 47 gradually decreases the DC output of the signal $P_6$ after the time $t_1$, as shown in FIG. 5b. The comparison circuit 46 compares the input signal $P_5'$ with a reference voltage prepared therein. The circuit 46 then produces a pulse each time the input signal $P_5'$ exceeds the reference voltage. Thus, a pulse signal $P_7$ having pulse widths corresponding to the waveform of the signal $P_5'$ can be obtained, as shown in FIG. 5c. In FIG. 5a, a part of the waveform of signal $P_5'$ is missing at a time $t_0$. This is because the track detection has failed at the time $t_0$. As a result, the circuit 46 produces the pulse signal $P_7$ of FIG. 5c, in which a single pulse is missing at the time to. The signals $P_6$ and $P_7$ are fed into a speed discrimination circuit 48. The circuit 48 produces a signal $P_8$ whose level is high as long as the signal $P_7$ has pulse intervals proportional to the level of the signal $P_6$. However, when one pulse of the signal $P_7$ is missing at the time $t_0$ because of an erroneous track detection, the signal $P_8$ becomes low, as shown in FIG. 5d. Here, the signal $P_7$ has several pulse intervals such as $tw_1$, $Tw_1$ and $tw_2$ ($tw_1 < Tw_1 < 2tW_1$).

Figure 5E:
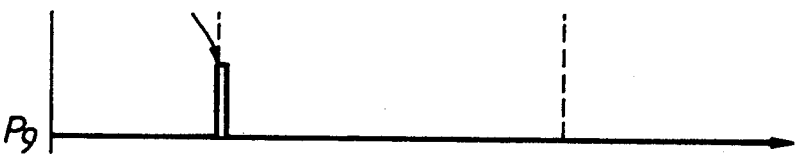
Figure 5F:

The signal $P_8$ is fed into a pulse generator circuit 49. When the level of the signal $P_8$ falls to a zero level because of an erroneous track detection, the circuit 49 outputs a pulse $P_9$ having a pulse width corresponding to the zero level of the signal $P_8$, as shown in FIG. 5e. However, the circuit 49 is inhibited from producing any pulses when the signal $P_6$ of FIG. 5b is smaller than $V_3$. The pulse $P_9$ and the signal $P_7$ are fed into an OR logic circuit 50 so as to be synthesized. Thus, the signal $P_7$ is supplemented with the pulse $P_9$. As a result, a track detection pulse signal $P_{10}$ can be obtained, as shown in FIG. 5f. The pulse signal $P_{10}$ is fed into a pulse counter 51 so as to be counted therein. The pulse count produced from the counter 51 is fed into the CPU 23. When this pulse count coincides with a predetermined track number to be crossed, the CPU 23 judges that the optical head 3 has achieved access to the desired track. As a result, the CPV 23 causes the linear motor control circuit 17 to stop the linear motor.

Figure 6:
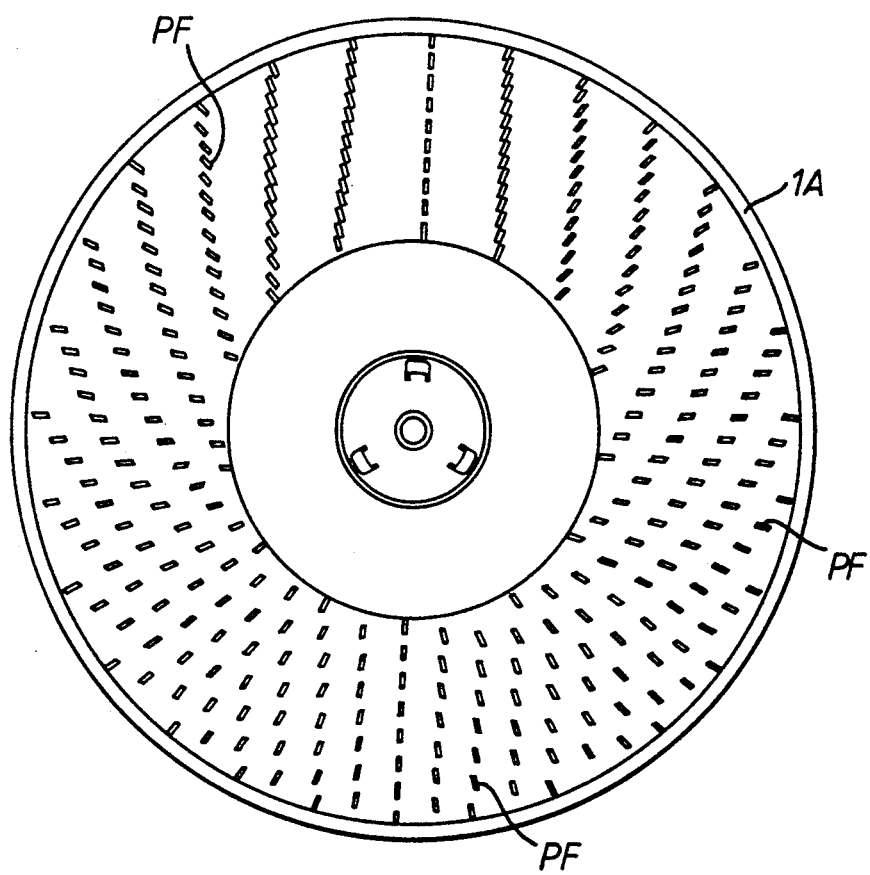
FIG. 6 is a plan view illustrating an optical disc with which one embodiment of this invention may be used.

FIG. 6 is a plan view illustrating an MCAV-type (a type of CAV, i.e., constant angular velocity) optical disc 1A as an example of optical discs. In FIG. 6, a large number of PFs (preformed format) are arranged in the radial direction of the optical disc 1A. The respective PFs have portions that include no pits. When the optical head 3 crosses one of such portions having no pits, the desired light beam cannot be reflected. As a result, a part of the track detection signal $P_5'$ is missing at the time $t_0$, as shown in FIG. 5a. However, in the tracking control apparatus according to the present invention, this missing pulse can be supplemented with the pulse signal $P_9$ of FIG. 5e. Thus, the desired track detection signal $P_{10}$ can be obtained, as shown in FIG. 5f. As a result, track accessing in the MCAV-type optical disc application can be achieved quickly and precisely.

Figure 7:
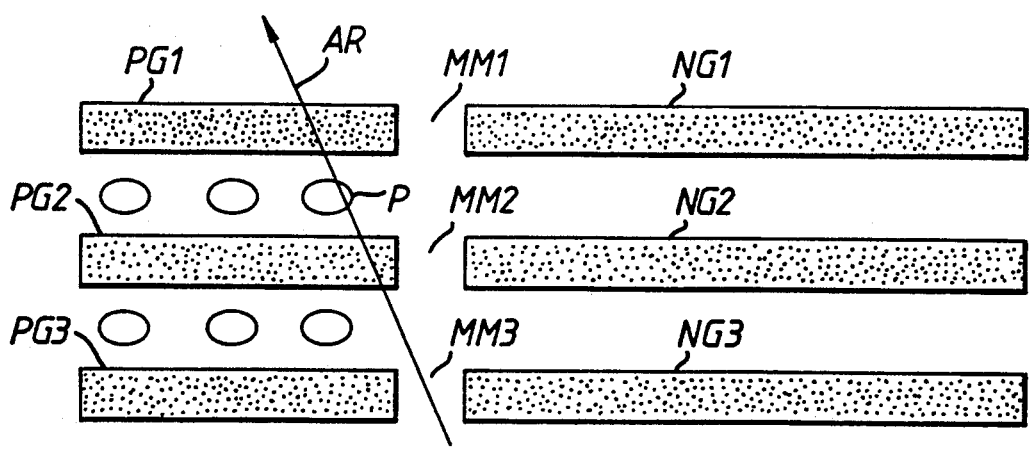
FIG. 7 is a partially enlarged schematic diagram of another optical disc for explaining the operation of one embodiment according to the present invention.

FIG. 7 shows a partially enlarged schematic plan view illustrating another type of PFs formed on an optical disc. In FIG. 7, pre-grooves $PG_1$, $PG_2$ and $PG_3$ are disposed before normal grooves $NG_1$, $NG_2$ and $NG_3$ with 1-byte mirror marks $MM_1$, $MM_2$ and $MM_3$ interposed therebetween. Further, a plurality of pits Ps, which have performed formats of 52 bytes, are formed as headers in the portions between the pre-grooves $PG_1$, $PG_2$ and $PG_3$. In a practical the pre-grooves $PG_1$, $PG_2$ and $PG_3$. In a practical application of the optical disc having the PFs of FIG. 7, the optical head crosses the tracks in the direction of arrow AR, as shown in FIG. 7. In this case, the optical head inevitably passes through a portion that includes no pits, i.e., the portion between the Pre-groove $PG_3$ and the normal groove $NG_3$. Thus, a part of a track detection signal will be missing. Further, when the optical head passes through the pit P, a high frequency component HF is superimposed on the track detection signal. However, in the tracking control apparatus according to the present invention, the missing part of the track detection signal can be supplemented with a pulse (see the signal $P_9$ of FIG. 5e). Moreover, the high frequency component HF superimposed on the track detection signal by the pit P can be eliminated. In addition, the track accessing of the optical head can be achieved quickly and precisely.

As described above, according to the present invention, the number of tracks scanned by an optical head can be counted quickly and precisely. This can be achieved even when the optical head crosses a flaw on the surface of the optical disc, or when it inevitably crosses a portion with no data tracks. Thus, the track access of this invention is faster and more accurate than the conventional tracking technique such as two-step access, i.e., coarse-and-fine access.

Obviously numerous additional modifications and variations of the present invention are possible in light of the above teachings. It is therefore to be understood that within the scope of the appended claims, the invention may be practiced otherwise than as specifically described herein.

What is claimed is:

1. An information processing apparatus for a disc-shaped information recording medium having a plurality of information recording tracks formed thereon with substantially equal distance therebetween in a spiral or concentric fashion, comprising:

recording/reproducing means for recording and reproducing information on and from said information recording track;

means for moving said recording/reproducing means at substantially a constant speed in a radial direction with respect to said medium;

detecting means for detecting information from said medium when said recording/reproducing means is moved in said radial direction of said medium;

track detection pulse signal extracting means for extracting an analog signal from the information detected by said detecting means when said recording/reproducing means is moved in said radial direction, said extracted analog signal being a series of pulses indicating each time said recording/reproducing means crosses one of said tracks;

speed signal generating means responsive to said analog signal from said track detection pulse signal extracting means for generating a speed signal corresponding to the radial speed of said recording/reproducing means;

missing pulse detecting means for detecting a missing pulse in the analog signal, wherein said missing pulse detecting means responds to the pulses of said analog signal from said track detection pulse signal extracting means and responds to the speed signal from said speed signal generating means to detect said missing pulse by an output signal;

pulse generating means for generating a digital pulse signal corresponding to the missing pulse, wherein said pulse generating means receives the output signal from said missing pulse detecting means to generate said pulse signal corresponding to the missing pulse; and correcting means for synthesizing a new analog signal from the extracted analog signal and the pulse signal generated by said pulse generating means.

2. The apparatus of claim 1, wherein said information recording medium includes an optical disc, and said recording/reproducing means includes light-emitting means and light-receiving means for receiving light reflected from said optical disc.

3. The apparatus of claim 2, wherein said light emitting means includes a semiconductor laser.

4. The apparatus of claim 1, wherein said information detecting means includes means for detecting light reflected from said track.

5. The apparatus of claim 4, wherein said missing pulse detecting means includes means for detecting reflected light having a reflection coefficient different from a normal reflected light reflected from a normal portion of said track.

6. An information processing apparatus for a disc-shaped information recording medium having a plurality of information tracks formed thereon with substantially equal distance therebetween in a spiral or concentric fashion comprising:

means for receiving a reflection beam from the information tracks;

means for moving said receiving means at substantially a constant speed in a radial direction with respect to said medium;

means for outputting a reproducing signal corresponding to the reflection beam from said medium when said receiving means is moved in the radial direction of said medium, the reproducing signal including a high frequency component corresponding to noise and an amplitude distortion portion corresponding to a reflection coefficient different from the normal portions;

means for removing the high frequency component from the reproducing signal;

means for standardizing the amplitude distortion portion of the reproducing signal; and means for extracting a track signal from the reproducing signal as modified by said removing means and said standardizing means, the track signal being a series of pulses indicating each time said receiving means crosses one of the information tracks;

speed signal generating means responsive to the track signal from said extracting means for generating a speed signal corresponding to the radial speed of said receiving means;

means for detecting a missing pulse in the track signal;

pulse generating means for generating a digital pulse signal corresponding to the missing pulse, and correcting means for synthesizing a new track signal from the extracted track signal and the digital pulse signal generated by said pulse generating means.

7. The apparatus of claim 6, wherein said removing means includes a low pass filter.

8. The apparatus of claim 6, wherein said means for standardizing the amplitude distortion portion includes an automatic gain control circuit.

* * * * *